(12) United States Patent
    Cho

(10) Patent No.: US 10,950,586 B2
(45) Date of Patent: Mar. 16, 2021

(54) SEMICONDUCTOR DEVICES HAVING UPPER AND LOWER SOLDER PORTIONS AND METHODS OF FABRICATING THE SAME

(71) Applicant: SAMSUNG ELECTRONICS CO., LTD., Suwon-si (KR)

(72) Inventor: Yun-Rae Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/437,595

(22) Filed: Jun. 11, 2019

(65) Prior Publication Data

US 2019/0295997 A1    Sep. 26, 2019

Related U.S. Application Data

(63) Continuation of application No. 15/374,392, filed on Dec. 9, 2016, now abandoned.

(30) Foreign Application Priority Data

Feb. 1, 2016  (KR) .................... 10-2016-0012409

(51) Int. Cl.
    *H01L 25/10*    (2006.01)
    *H01L 23/31*    (2006.01)
        (Continued)

(52) U.S. Cl.
    CPC ........ *H01L 25/105* (2013.01); *H01L 21/4853* (2013.01); *H01L 21/565* (2013.01);
        (Continued)

(58) Field of Classification Search
    CPC . H01L 25/105; H01L 23/49811; H01L 25/50; H01L 21/565; H01L 23/49866;
        (Continued)

(56) References Cited

U.S. PATENT DOCUMENTS 5,914,536 A    6/1999  Shizuki et al.
6,066,551 A    5/2000  Satou et al.
        (Continued)

FOREIGN PATENT DOCUMENTS

JP    H08139097 A    5/1996
JP    3398276 B2    4/2003
        (Continued)

OTHER PUBLICATIONS

Office Action issued in parent U.S. Appl. No. 15/374,392 dated Oct. 23, 2017.
        (Continued)

*Primary Examiner* — Alexander O Williams
(74) *Attorney, Agent, or Firm* — Sughrue Mion, PLLC

(57) ABSTRACT

A semiconductor device includes a package substrate, a semiconductor chip on a first region of the package substrate, and a solder bump on a second region of the package substrate. The solder bump includes a core portion and a peripheral portion encapsulating the core portion. The peripheral portion includes a first segment with a first melting point and a second segment with a second melting point that is less than the first melting point.

7 Claims, 8 Drawing Sheets

(51) Int. Cl.
*H01L 21/48* (2006.01)
*H01L 21/56* (2006.01)
*H01L 23/498* (2006.01)
*H01L 25/00* (2006.01)
*H01L 23/00* (2006.01)
*H01L 25/065* (2006.01)
*H01L 25/18* (2006.01)

(52) U.S. Cl.
CPC .... *H01L 23/3128* (2013.01); *H01L 23/49811* (2013.01); *H01L 23/49866* (2013.01); *H01L 25/50* (2013.01); *H01L 23/49816* (2013.01); *H01L 24/13* (2013.01); *H01L 24/16* (2013.01); *H01L 24/32* (2013.01); *H01L 24/48* (2013.01); *H01L 24/73* (2013.01); *H01L 25/0657* (2013.01); *H01L 25/18* (2013.01); *H01L 2224/131* (2013.01); *H01L 2224/16225* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/0651* (2013.01); *H01L 2225/1023* (2013.01); *H01L 2225/1041* (2013.01); *H01L 2225/1058* (2013.01); *H01L 2924/1431* (2013.01); *H01L 2924/1434* (2013.01); *H01L 2924/15311* (2013.01); *H01L 2924/15331* (2013.01); *H01L 2924/1815* (2013.01); *H01L 2924/18161* (2013.01)

(58) Field of Classification Search
CPC ......... H01L 21/4853; H01L 2225/1023; H01L 25/10; H01L 21/48; H01L 21/56; H01L 23/498; H01L 25/00; H01L 23/31; H01L 25/565; H01L 23/3128; H01L 24/13; H01L 2224/48091; H01L 2924/1815; H01L 2224/1815; H01L 2224/73265; H01L 2924/15331; H01L 23/49816; H01L 2225/1041; H01L 2224/32145; H01L 2924/1434; H01L 24/16; H01L 2225/1058; H01L 2924/000012; H01L 2924/1431; H01L 2224/48227; H01L 2924/00014; H01L 2924/00012; H01L 2224/131; H01L 2224/16227; H01L 2924/15311; H01L 2924/18161; H01L 25/0657; H01L 2224/32225; H01L 24/32; H01L 25/18; H01L 24/73; H01L 24/48; H01L 2224/16225; H01L 2924/014; H01L 2924/00
USPC ....... 257/734, 737, 738, 777, 685, 686, 723, 257/728
See application file for complete search history.

(56) References Cited

U.S. PATENT DOCUMENTS

| | | | |
|---|---|---|---|
| 6,204,558 B1 | 3/2001 | Yanagida | |
| 6,259,159 B1 | 7/2001 | Dalal et al. | |
| 6,278,180 B1 | 8/2001 | Mizushima et al. | |
| 6,283,359 B1 | 9/2001 | Brofman et al. | |
| 6,333,554 B1 | 12/2001 | Kitajima et al. | |
| 6,340,113 B1* | 1/2002 | Avery ............... | B23K 35/0244 228/248.5 |
| 6,344,234 B1 | 2/2002 | Dalal et al. | |
| 6,433,425 B1* | 8/2002 | Sarkhel ............... | H01L 23/488 228/180.22 |
| 6,940,175 B2 | 9/2005 | Iwazaki et al. | |
| 7,053,491 B2 | 5/2006 | Martin et al. | |
| 7,221,045 B2 | 5/2007 | Park et al. | |
| 7,265,046 B2 | 9/2007 | Kondo et al. | |
| 7,387,910 B2 | 6/2008 | Lee et al. | |
| 7,671,477 B2 | 3/2010 | Ikeda | |
| 7,737,552 B2 | 6/2010 | Beyne | |
| 7,786,001 B2 | 8/2010 | Buchwalter et al. | |
| 7,868,457 B2 | 1/2011 | Furman et al. | |
| 8,536,462 B1 | 9/2013 | Darveaux et al. | |
| 8,809,181 B2* | 8/2014 | Sidhu ............... | B23K 35/22 257/E21.509 |
| 8,987,918 B2 | 3/2015 | Razdan et al. | |
| 9,597,752 B2 | 3/2017 | Cheng et al. | |
| 9,662,730 B2* | 5/2017 | Hattori ............... | H01L 21/4853 |
| 2002/0017721 A1* | 2/2002 | Huang ............... | H01L 21/4853 257/724 |
| 2002/0171157 A1 | 11/2002 | Soga et al. | |
| 2002/0190392 A1 | 12/2002 | Iwazaki et al. | |
| 2008/0142966 A1* | 6/2008 | Hirano ............... | H01L 21/6835 257/737 |
| 2009/0057897 A1* | 3/2009 | Patwardhan ......... | B23K 1/0016 257/738 |
| 2009/0146301 A1* | 6/2009 | Shimizu ............. | H01L 24/27 257/738 |
| 2009/0243096 A1 | 10/2009 | Tsai | |
| 2010/0171207 A1 | 7/2010 | Shen et al. | |
| 2011/0024904 A1 | 2/2011 | Egawa | |
| 2012/0193783 A1 | 8/2012 | Hong et al. | |
| 2012/0319274 A1 | 12/2012 | Tanaka et al. | |
| 2012/0319289 A1 | 12/2012 | Mori et al. | |
| 2013/0154108 A1 | 6/2013 | Lin et al. | |
| 2014/0035150 A1* | 2/2014 | Gruber ............... | H01L 23/48 257/772 |
| 2014/0124925 A1 | 5/2014 | Sidhu et al. | |
| 2014/0183733 A1 | 7/2014 | Chu et al. | |
| 2015/0014856 A1 | 1/2015 | Mohammed et al. | |
| 2015/0035148 A1* | 2/2015 | Lee ................... | H01L 23/49811 257/738 |
| 2015/0061129 A1* | 3/2015 | Hattori ............... | H01L 21/4853 257/738 |
| 2015/0325507 A1 | 11/2015 | Uzoh et al. | |
| 2016/0118333 A1* | 4/2016 | Lin .................... | H01L 24/97 257/773 |
| 2016/0190053 A1* | 6/2016 | Machida ............ | H01L 23/49827 361/768 |
| 2016/0190056 A1* | 6/2016 | Park ................... | H01L 21/486 257/692 |
| 2016/0315040 A1* | 10/2016 | Son ................... | H01L 21/4853 |
| 2016/0351544 A1 | 12/2016 | Machida | |
| 2016/0372433 A1 | 12/2016 | Shi et al. | |
| 2017/0053898 A1 | 2/2017 | Yeh et al. | |
| 2017/0110392 A1 | 4/2017 | Lin et al. | |
| 2017/0136582 A1 | 5/2017 | Cheng et al. | |
| 2017/0221866 A1* | 8/2017 | Cho ................... | H01L 23/3128 |
| 2017/0243848 A1 | 8/2017 | Nah | |
| 2017/0250154 A1 | 8/2017 | Chi et al. | |
| 2018/0158768 A1* | 6/2018 | Kim .................. | H01L 23/49838 |
| 2018/0261569 A1* | 9/2018 | Yang ................. | H01L 25/50 |
| 2018/0358288 A1* | 12/2018 | Lee ................... | H01L 21/4853 |
| 2019/0131261 A1* | 5/2019 | Yu .................... | H01L 23/498 |
| 2019/0375054 A1* | 12/2019 | Kawasaki ........... | B32B 15/043 |

FOREIGN PATENT DOCUMENTS

| | | |
|---|---|---|
| JP | 4736762 B2 | 7/2011 |
| KR | 10-1085525 B1 | 11/2011 |

OTHER PUBLICATIONS

Office Action issued in parent U.S. Appl. No. 15/374,392 dated Apr. 19, 2018.
Office Action issued in parent U.S. Appl. No. 15/374,392 dated Oct. 12, 2018.
Notice of Allowance issued in parent U.S. Appl. No. 15/374,392 dated Apr. 8, 2019.

* cited by examiner

US 10,950,586 B2

SEMICONDUCTOR DEVICES HAVING UPPER AND LOWER SOLDER PORTIONS AND METHODS OF FABRICATING THE SAME

CROSS-REFERENCE TO RELATED APPLICATIONS

This is a continuation of U.S. application Ser. No. 15/374,392 filed Dec. 9, 2016, which claims priority under 35 U.S.C. § 119 of Korean Patent Application 10-2016-0012409 filed on Feb. 1, 2016, the entire contents of which are hereby incorporated by reference.

BACKGROUND

The present inventive concepts relate to semiconductor devices and methods of fabricating the same and, more particularly, to semiconductor devices including a package substrate on which a semiconductor chip and a solder bump are provided, and methods of fabricating the same.

In an effort to meet the competing demands of compact size and increased functionality of mobile devices, there has been an increased reliance on semiconductor devices that use a package-on-package (POP) packaging technique. In POP-based products, solder joints are typically used to electrically connect a top package to a bottom package. The top and bottom packages may include different types of semiconductor devices. For example, one of the top and bottom packages may include a memory chip, while the other may include a logic chip. To obtain a good electrical connection between the top and bottom packages, it is desirable for the solder joint to have high reliability. When connecting top and bottom packages, a solder structure including multiple solder joints may be formed between the two packages. It is generally desirable for the solder structure to have a fine pitch between solder joints and also for the solder structure not to have electrical shorts between adjacent solder joints. However, as semiconductor devices become miniaturized to an even greater degree, electrical shorts can occur between adjacent solder joints in a solder structure.

SUMMARY

Embodiments of the present inventive concepts provide semiconductor devices and methods of fabricating the same that are capable of providing a solder joint structure with a fine pitch.

According to exemplary embodiments of the present inventive concepts, a semiconductor device includes a package substrate, a semiconductor chip on a first region of the package substrate, and a solder bump on a second region of the package substrate. The solder bump includes a core portion, and a peripheral portion encapsulating the core portion. The peripheral portion includes a first segment with a first melting point, and a second segment with a second melting point less than the first melting point.

According to exemplary embodiments of the present inventive concepts, a method for fabricating a semiconductor package includes providing a lower package substrate, forming a first solder on a top surface of the lower package substrate, providing an upper package substrate including a second solder on a bottom surface of the upper package substrate, and joining the first and second solders to stack the lower and upper package substrates. Forming the first solder may include forming a first solder ball on the lower package substrate, the first solder ball including a first material with a first melting point, placing a second solder ball on the first solder ball, the second solder ball including a core portion and a second material encapsulating the core portion, the second material having a second melting point less than the first melting point, and performing a first reflow process at a first temperature greater than the second melting point and less than the first melting point so as to join the second material to the first material.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF EMBODIMENTS

Figure 1:
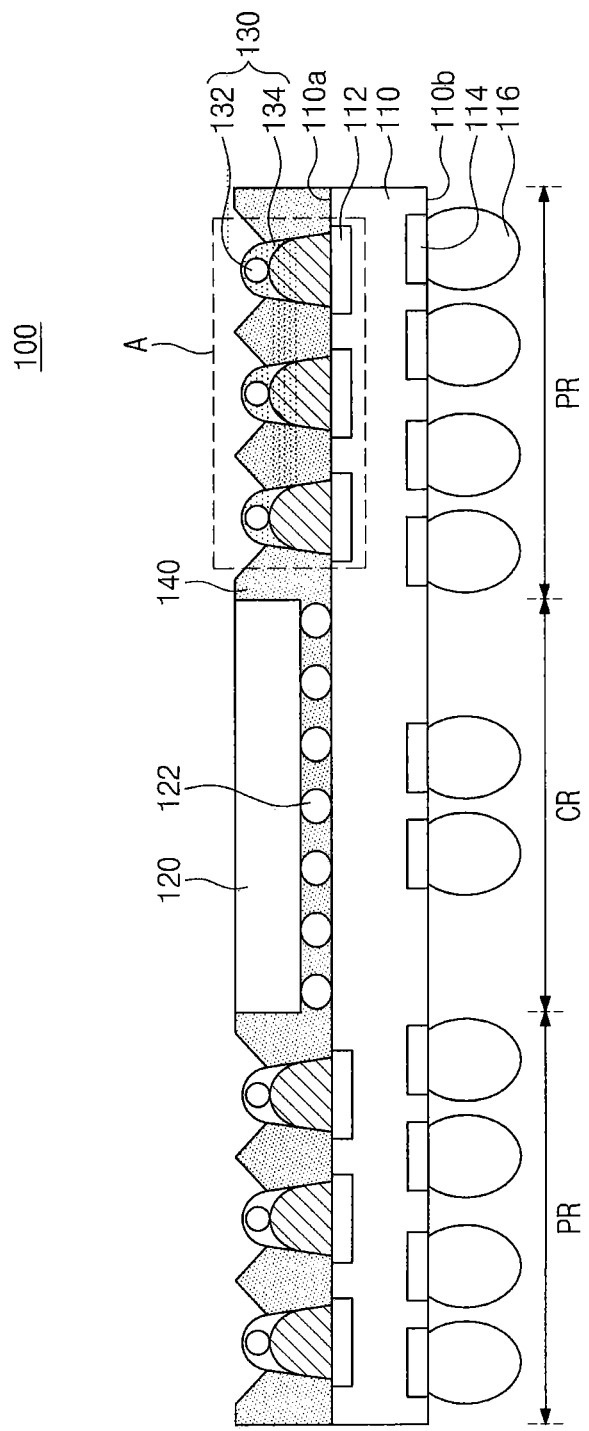
FIG. 1 shows a semiconductor device according to exemplary embodiments of the present inventive concepts.
Figure 2:
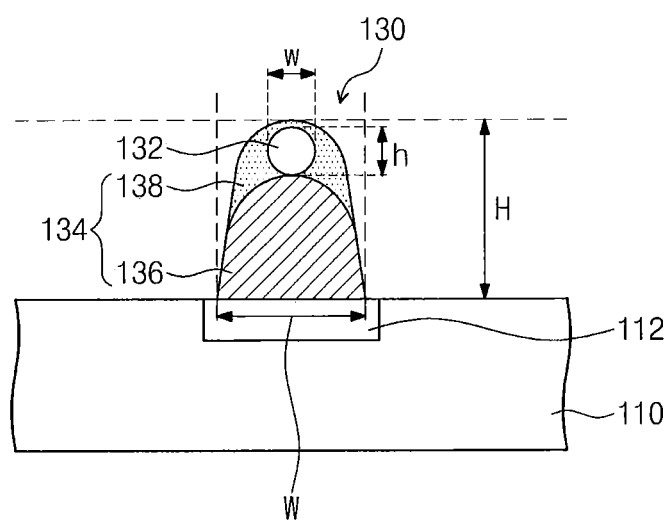
FIG. 2 shows an enlarged view of a first solder of FIG. 1.

FIG. 1 shows a semiconductor device 100 according to exemplary embodiments of the present inventive concepts. FIG. 2 shows an enlarged view of a first solder bump 130 of FIG. 1. A semiconductor device 100 will be explained hereinafter with reference to FIGS. 1 and 2. The semiconductor device 100 may include a first package substrate 110 and a plurality of first solder bumps 130 disposed on a top surface 110a of the first package substrate 100. Other semiconductor devices may be stacked on the semiconductor device 100. For example, the semiconductor device 100 may be a bottom package as a part of a package-on-package (PoP) structure, but the present embodiment is not limited thereto. Referring to FIG. 1, the semiconductor device 100 may include the first package substrate 110, a first semiconductor chip 120 mounted on the first package substrate 110, the first solder bumps 130 disposed on the first package substrate 110, and a first mold layer 140. Although a plurality of first solder bumps 130 are illustrated in FIG. 1, the inventive concepts are not limited thereto.

The first package substrate 110 may be a printed circuit board (PCB). The first package substrate 110 may further include a bottom surface 110b opposite to the top surface 110a. A plurality of first pads 112 may be provided on the top surface 110a of the first package substrate 110, and a plurality of second pads 114 may be provided on the bottom surface 110b of the first package substrate 110. The plurality of the first solder bumps 130 may be respectively disposed on the first pads 112. An outer solder 116 may be disposed on each of the second pads 114. Structural features of the first solder bump 130 may be discussed in detail later. The outer solder 116 may electrically connect the semiconductor device 100 to any other external devices.

The first semiconductor chip 120 may be mounted on the top surface 110a of the first package substrate 110. The first semiconductor chip 120 may be disposed on a first region CR of the first package substrate 110. For example, as shown in FIG. 1, the first region CR may be a central region of the first package substrate 110. One or more solder bumps 122 may be used to mount the first semiconductor chip 120 in a flip chip manner. The first semiconductor chip 120 may be a logic chip. Alternatively, the first semiconductor chip 120 may be a logic chip, a memory chip, or a combination thereof.

The first solder bump 130 may be mounted on the top surface 110a of the first package substrate 110. The first solder bump 130 may be disposed on a second region PR of the first package substrate 110. For example, as shown in FIG. 1, the second region PR may be an edge region of the first package substrate 110.

Referring to FIGS. 1 and 2, the first solder bump 130 may include a core portion 132 and a peripheral portion 134. The core portion 132 may include copper (Cu). The core portion 132 may be provided within the first solder bump 130. The peripheral portion 134 may be provided to encapsulate the core portion 132. The peripheral portion 134 may include a plurality of materials with different melting points. For example, the peripheral portion 134 may include a first segment 136 and a second segment 138. As shown in FIG. 2, the first segment 136 may be a lower part of the first solder bump 130 and the second segment 138 may be an upper part of the first solder bump 130. The second segment 138 may envelop the core portion 132.

The first segment 136 may include a first material with a first melting point. The second segment 138 may include a second material with a second melting point. The second melting point may be less than the first melting point. For example, the second melting point may be lower than the first melting point by a temperature of about 20° C. to about 120° C. For example, the first material may include an Sn—Ag based alloy or an Sn—Cu based alloy, and the second material may include an Sn—Pb based alloy or an Sn—Bi based alloy. The first and second melting points may be less than that of material (e.g., copper) included in the core portion 132. For example, the Sn—Ag based and Sn—Cu based alloys may have melting points, which may vary depending on its composition ratio, in a range of about 214° C. to about 221° C. and about 217° C. to about 227° C., respectively. The Sn—Pb based and Sn—Bi based alloys may have melting points, which may vary depending on its composition ratio, in a range of about 180° C. to about 190° C. and about 135° C. to about 145° C., respectively. The melting point of copper (Cu) may be in a range of about 1080° C. to about 1090° C.

Referring again to FIGS. 1 and 2, the first solder bump 130 may have a height H substantially equal to or greater than a width W thereof. Accordingly, the first solder bump 130 may have an aspect ratio of about 1 or more. The height H of the first solder bump 130 may mean a vertical length extending from the top surface 110a of the first package substrate 110, and the width W of the first solder bump 130 may mean a maximum horizontal length extending parallel to the top surface 110a of the first package substrate 110. In an embodiment, the height H of the first solder bump 130 may be about 1 or about 1.5 times the width W of the first solder bump 130. For example, the height H of the first solder bump 130 may be in a range of about 120 μm to about 150 μm and the width W of the first solder bump 130 may be in a range of about 100 μm to about 120 μm, but the present embodiment is not limited thereto. As shown in FIG. 2, the first segment 136 may have a width substantially equal to or greater than that of the second segment 138. For example, the second segment 138 may have a width that decreases with increasing distance from the first segment 136. A height h of the core portion 132 may be less than about one-fifth to about one-third of the height H of the first solder bump 130. For example, the height h of the core portion 132 may be about 50 μm or less. The core portion 132 may have a spherical shape whose width w and height h are substantially the same. The first solder bump 130 may have the width W that gradually decreases from the lower part toward the upper part thereof, such that it may be possible to obtain an improved contact margin between the first solder bumps 130. In addition, the gradually decreased width W may prevent an electrical short from occurring between the first solder bumps 130.

The first mold layer 140 may be disposed on the top surface 110a of the first package substrate 110. For example, the first mold layer 140 may include epoxy resin. The first mold layer 140 may have a top surface that is approximately coplanar with a top surface of the first semiconductor chip 120. The first mold layer 140 may expose at least a portion of the first solder bump 130. For example, the first mold layer 140 may expose an upper portion of the first solder bump 130.

Figure 3A:
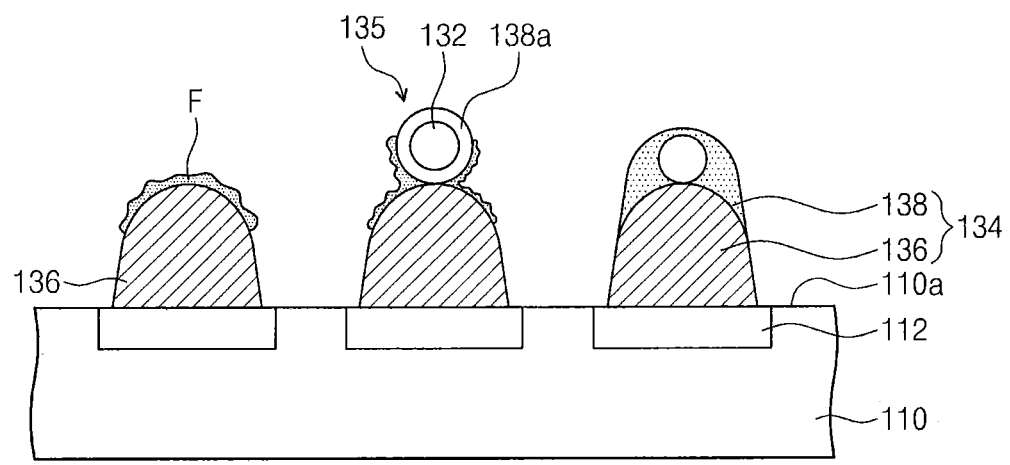
FIGS. 3A to 3C show a procedure for forming a section A of FIG. 1.
Figure 3B:
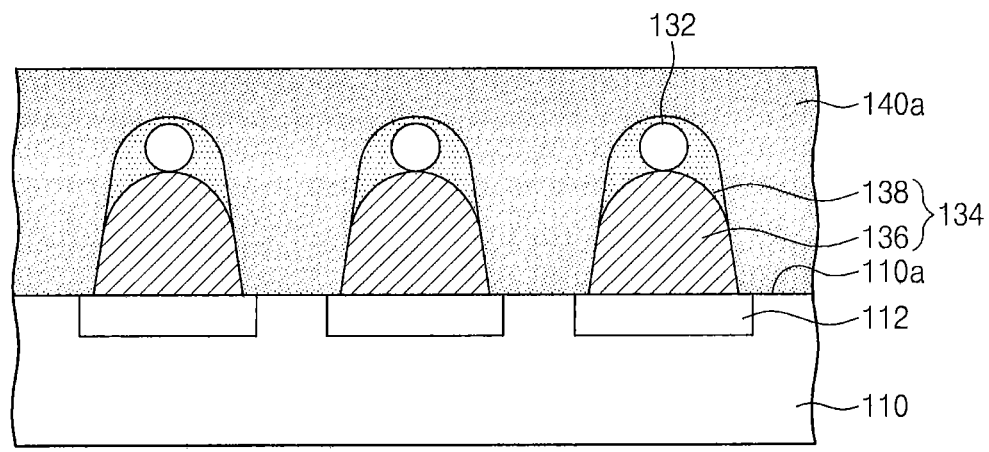
Figure 3C:
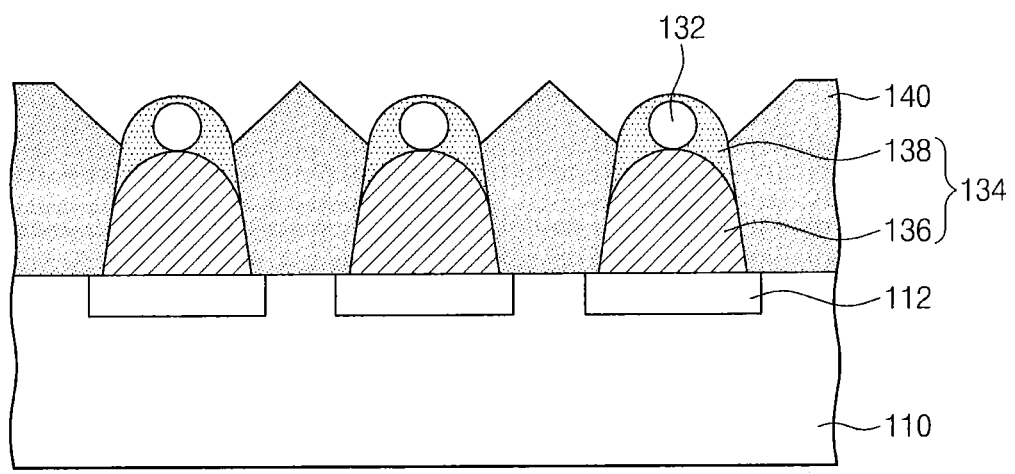

FIGS. 3A to 3C show a procedure for forming the solder bump 130 shown in section A of FIG. 1. Hereinafter, a procedure for forming the first solder bump 130 will be described with reference to FIGS. 1, 2 and 3A to 3C.

Referring to FIGS. 1, 2 and 3A, a first solder ball 136 may be formed on the top surface 110a of the first package substrate 110. The first solder ball 136 may correspond to the first segment 136 discussed above. The first solder ball 136 may be formed of the first material with the first melting point. In some embodiments, the first material may include an Sn—Ag based alloy and/or an Sn—Cu based alloy. The Sn—Ag based and Sn—Cu based alloys may have melting points that vary depending on their material composition ratios in a range of about 214° C. to about 221° C. and about 217° C. to about 227° C., respectively.

A flux F may be coated on the first solder ball 136, and a second solder ball 135 may be placed on the first solder ball 136. The second solder ball 135 may include the core portion 132 and a preliminary peripheral portion 138a. The core portion 132 may, for example, include copper (Cu). The preliminary peripheral portion 138a may be formed of the second material with the second melting point that is less than the first melting point. For example, the second melting point may be lower than the first melting point by a temperature of about 20° C. to about 120° C. In some embodiments, the second material may include an Sn—Pb based alloy and/or an Sn—Bi based alloy. The Sn—Pb based and Sn—Bi based alloys may have melting points that vary depending on their material composition ratios in a range of about 180° C. to about 190° C. and about 135° C. to about 145° C., respectively. The core portion 132 may have a melting point that is greater than the first and second melting points, and in some embodiments that is substantially greater than the first and second melting points. For example, the core portion 132 may be formed of copper (Cu), which has a melting point in a range of about 1080° C. to about 1090° C.

After the second solder ball 135 has been placed on the first solder ball 136, a first reflow process may be performed at a first temperature. The first temperature may be greater than the second melting point and less than the first melting point. That is, the first temperature may be greater than the melting point of the preliminary peripheral portion 138a of the second solder ball 135 but less than the melting point of the first solder ball 136. In the first reflow process, the preliminary peripheral portion 138a may melt and become wetted to the first solder ball 136, i.e., the first segment. Since the core portion 132 and the first solder ball 136 have melting points greater than the first temperature, the preliminary peripheral portion 138a may be selectively wetted to form the second segment 138.

In another aspect, the first solder bump 130 may be formed by wetting the preliminary peripheral portion 138a of the second solder ball 135 to the first solder ball 136 through a first reflow process performed at a first temperature. The first temperature is greater than the melting point of the preliminary peripheral portion 138a but less than the melting point of the first solder ball 136. The resulting solder bump 130 includes a base portion 136, an upper portion 138 on the base portion 136, and a core portion 132 embedded in the upper portion 138. The upper portion 138 has a melting point that is lower than the melting point of the base portion 136 and lower than the melting point of the core portion 132. Moreover, the base portion 136 has a width that is greater than a width of the upper portion 138 of the preliminary solder bump 130. For example, the widths of the base portion 136 and the upper portion 138 of the preliminary solder bump 130 are maximum widths of the base portion 136 and the upper portion 138 of the preliminary solder bump 130, respectively.

Referring to FIGS. 1, 2, 3B and 3C, the first mold layer 140 may be formed on the top surface 110a of the first package substrate 110. For example, an exposed mold underfill (e-MUF) process may be carried out to coat a first mold resin 140a. The first mold resin 1340a may include, for example, an epoxy resin. The first mold resin 140a may be provided to cover the first semiconductor chip 120, and thereafter a grinding process may be performed to remove an upper portion of the first mold layer 140. The first mold layer 140 may thereby have a top surface that is approximately coplanar to a top surface of the first semiconductor chip 120. Next, a process, such as a laser drilling process, may be performed to expose at least a portion of the first solder bump 130 from the first mold layer 140. For example, the first mold layer 140 may expose an upper portion of the first solder bump 130.

Figure 4:
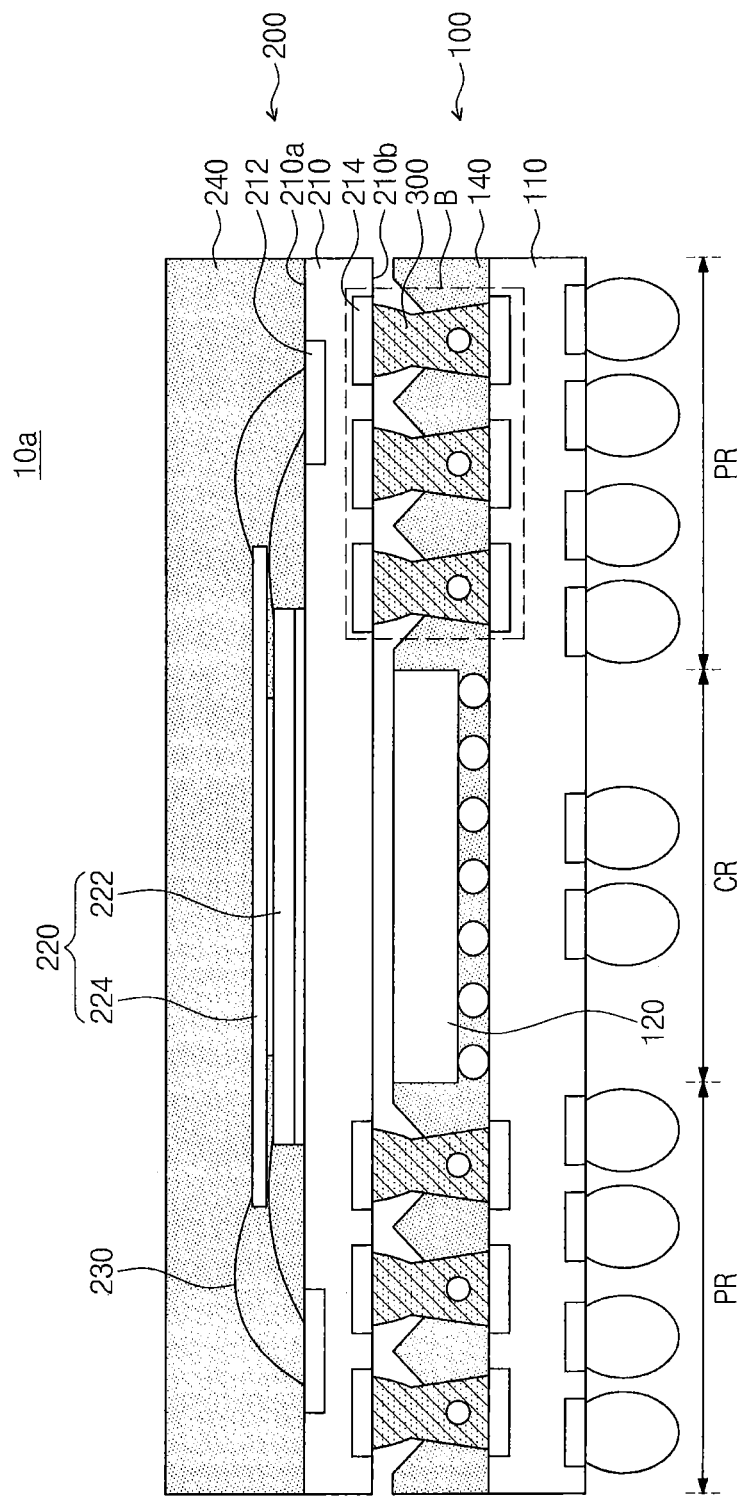
FIG. 4 shows a semiconductor device according to exemplary embodiments of the present inventive concepts.

FIG. 4 shows a semiconductor device 10a according to exemplary embodiments of the present inventive concepts. A semiconductor device 10a may be a semiconductor package, for example, a package-on-package (PoP). The semiconductor device 10a may include a bottom package 100 and a top package 200 mounted on the bottom package 100. The bottom package 100 may be the same as the semiconductor device discussed with reference to FIGS. 1 to 3C, and therefore further description of the bottom package 100 will be omitted for the sake of brevity. Referring to FIG. 4, the top package 200 may include a second package substrate 210, a second semiconductor chip 220 mounted on the second package substrate 210, a wire 230 that electrically connects the second semiconductor chip 220 to the second package substrate 210, and a second mold layer 240. The top package 200 may be connected to the bottom package 100 through a solder joint 300.

The second package substrate 210 may be a printed circuit board (PCB). The second package substrate 210 may include a top surface 210a on which a plurality of third pads 212 are provided and a bottom surface 210b on which a plurality of fourth pads 214 are provided. A plurality of wire 230s may be provided, and the plurality of the wires 230 may be respectively connected to the third pads 212. A plurality of solder joints 300 may be provided, and the plurality of the solder joints 300 may be respectively connected to the fourth pads 214.

A plurality of second semiconductor chips 220 may be provided. For example, the top package 200 may include two semiconductor chips 222 and 224 that are sequentially stacked. In some embodiments, the second semiconductor chip 220 may be a memory chip. Alternatively, the second semiconductor chip 220 may be a logic chip, a memory chip, or a combination thereof. FIG. 4 shows an embodiment in which two second semiconductor chips 222 and 224 are mounted using wire, but the present inventive concepts are not limited thereto. For example, a single second semiconductor chip may be provided to be mounted in a flip chip manner. The wires 230 may electrically connect the second semiconductor chips 222 and 224 to the second package substrate 210. The second mold layer 240 may be disposed on the top surface 210a of the second package substrate 210. For example, the second mold layer 240 may include an epoxy resin.

Figure 5A:
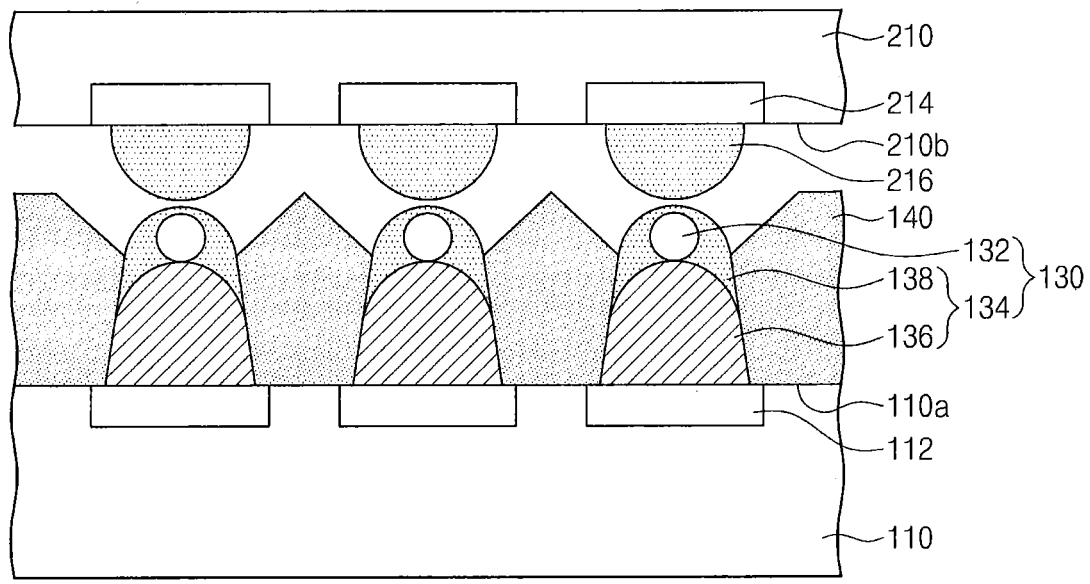
FIGS. 5A through 5C show a procedure for forming a section B of FIG. 4.

The first solder bump 130 discussed above may be joined together with a second solder bump 216 of FIG. 5A so as to form the solder joint 300. The second solder bump 216 may be formed of the second material. For example, the second material may include an Sn—Pb based alloy or an Sn—Bi based alloy. The Sn—Pb based and Sn—Bi based alloys may have melting points which vary depending on their material composition ratio in a range of about 180° C. to about 190° C. and about 135° C. to about 145° C., respectively.

Figure 5B:
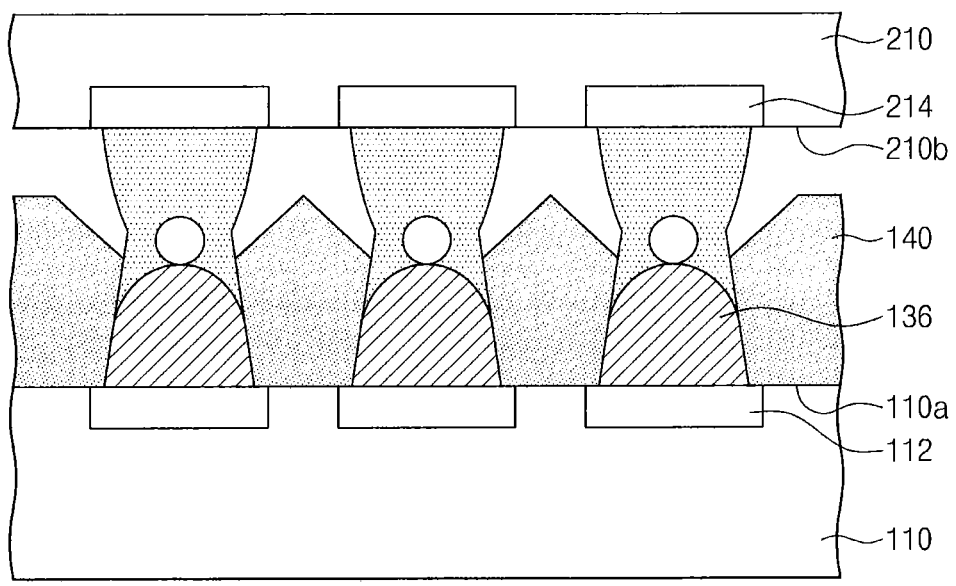
Figure 5C:
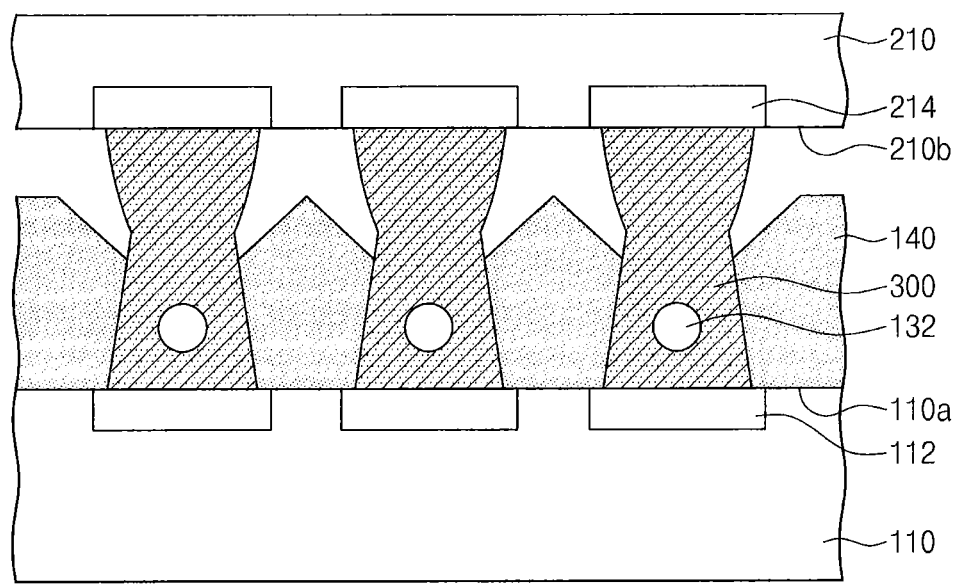

FIGS. 5A through 5C show a procedure for forming a solder connection as illustrated in section B of FIG. 4. Referring to FIGS. 4, 5A and 5B, a second reflow process may be performed to join the first solder bump 130 and the second solder bump 216. The second reflow process may be performed at the first temperature. The first temperature may be greater than the second melting point and less than the first melting point. For example, the first temperature may be about 200° C. Because the second segment 138 (e.g., the upper portion 138) of the first solder bump 130 is formed of the second material, which is the same as that of the second solder bump 216, the second solder 136 bump may melt and join together with the upper portion 138 of the first solder bump 130.

Referring to FIGS. 4 and 5C, after the first solder bump 130 and the second solder bump 216 have been joined, the first solder bump 130 may be wetted at a second temperature (e.g., by reflow process) that is greater than the first temperature. For example, the second temperature may be higher than the first and second melting points and lower than the melting point of the core portion 132. The second temperature may be, for example, about 300° C. The wetting of the first segment 136 may cause the first material in the first segment 136 (e.g., the lower portion 136) and the second material in the second segment 138 (e.g., the upper portion 138) and the second solder bump 216 to mix so that the first and second solder bumps 130, 216 form a solder joint 300. The core portion 132 may be provided in a lower part of the solder joint 300.

Figure 6:
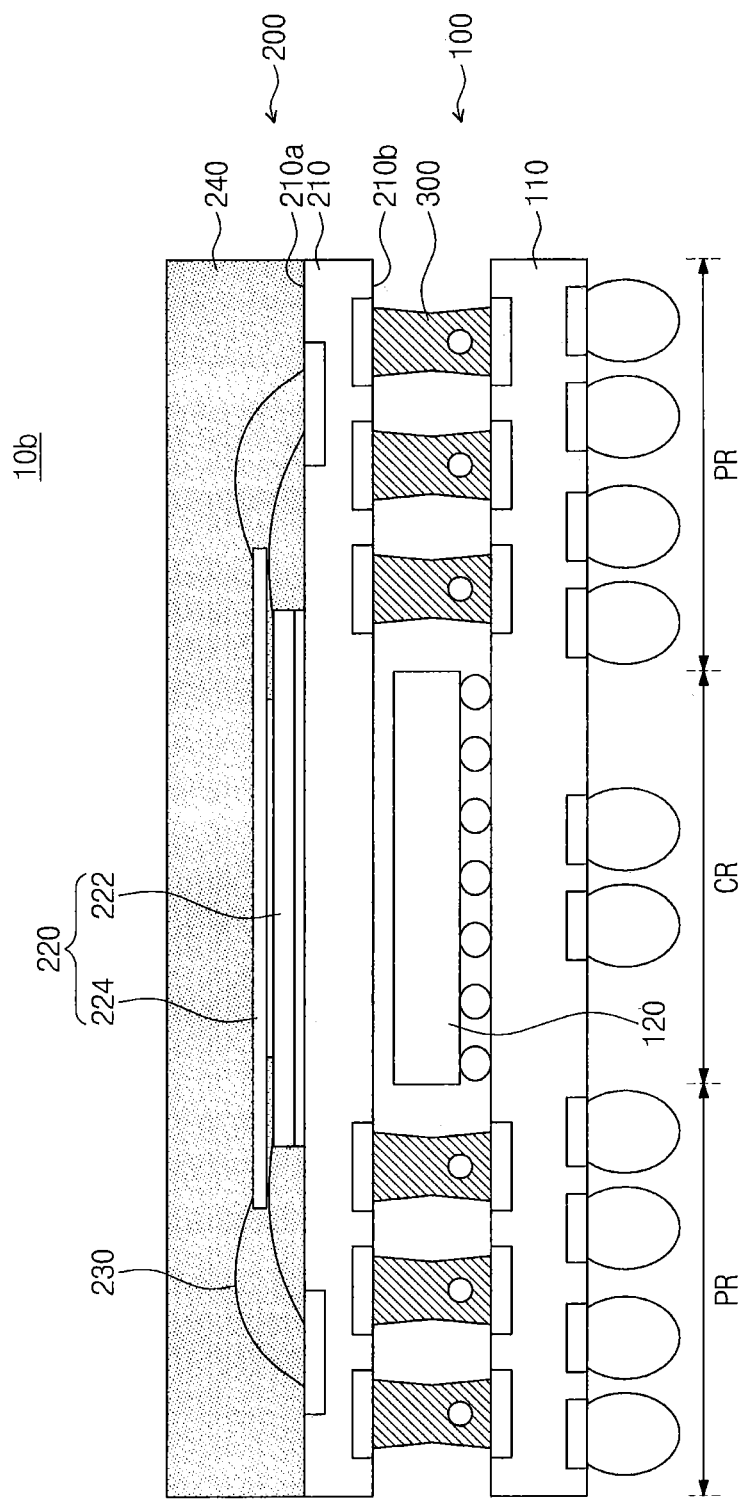
FIG. 6 shows a semiconductor device according to exemplary embodiments of the present inventive concepts.

FIG. 6 shows a semiconductor device 10b according to exemplary embodiments of the present inventive concepts. A semiconductor device 10b may be a semiconductor package, such as a package-on-package (PoP), and elements of the semiconductor device 10b that are substantially the same as those of the semiconductor device 10a discussed with reference to FIGS. 4 through 5C are allocated the same reference numerals thereto for which further description thereof will be omitted for the sake of brevity. In contrast to the semiconductor device 10a of FIG. 4, the semiconductor device 10b may have no first mold layer on the top surface 110a of the first package substrate 110.

According to some embodiments of the present inventive concepts, a solder bump may include a base portion and a peripheral portion on the base portion that envelopes a core portion therein. The peripheral portion has a melting point different from that of the base portion. Accordingly, a reflow joining processes may be sequentially performed at different temperatures. The reflow process may be partially performed in such a way that the area occupied by the solder bump may be reduced. In addition, the solder bump may have the width that decreases with increasing distance from the package substrate, and thus it may be possible to improve a contact margin between adjacent solder bumps, which may contribute to a reduction of electrical shorts between adjacent solder joints and/or may enable reduction of a pitch between adjacent solder joints. The solder bump may also have an enhanced aspect ratio. Furthermore, the reflow process may allow the solder bump to have a fine pitch without the necessity of providing an interposer and/or performing additional processes.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor device comprising:
   a first package substrate;
   a second package substrate; and
   a solder joint between the first package substrate and the second package substrate,
   wherein the solder joint comprises:
   a core portion;
   a lower solder portion comprising an Sn—Ag based alloy or an Sn—Cu based alloy, the lower solder portion having a first melting point and being disposed on and contacting a first contact pad of the first package substrate; and
   an upper solder portion comprising an Sn—Pb based alloy or an Sn—Bi based alloy, the upper solder portion having a second melting point and being disposed on and contacting a second contact pad of the second package substrate and an uppermost surface of the lower solder portion,
   wherein the lower solder portion at least partially envelops the core portion,
   wherein the core portion has a melting point greater than the first melting point and the second melting point, and
   wherein a height of the core portion is less than one-fifth to one-third of a height of the solder joint.

2. The semiconductor device of claim 1, wherein the second melting point is less than the first melting point.

3. The semiconductor device of claim 2, wherein the second melting point is less than the first melting point by a temperature of about 20° C. to about 100° C.

4. The semiconductor device of claim 2, wherein the first melting point is in a range of about 210° C. to about 230° C., and
the second melting point is in a range of about 135° C. to about 190° C.

5. The semiconductor device of claim 1, wherein the lower solder portion is a lower part of the solder joint near the first package substrate and the upper solder portion is an upper part of the solder joint opposite the first package substrate.

6. The semiconductor device of claim 1, wherein the core portion is disposed inside the lower solder portion.

7. The semiconductor device of claim 1, further comprising a mold layer covering the first package substrate and the solder joint, an upper portion of the solder joint being exposed from the mold layer.

* * * * *